United States Patent
Xie et al.

(10) Patent No.: US 8,443,130 B2
(45) Date of Patent: May 14, 2013

(54) USB PORT DETECTING CIRCUIT

(75) Inventors: Ling-Yu Xie, Shenzhen (CN);
Xing-Ping Xie, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 113 days.

(21) Appl. No.: 13/169,758

(22) Filed: Jun. 27, 2011

(65) Prior Publication Data

US 2012/0153993 A1    Jun. 21, 2012

(30) Foreign Application Priority Data

Dec. 15, 2010 (CN) .......................... 2010 1 0589289

(51) Int. Cl.
*G06F 3/00* (2006.01)
*G06F 11/00* (2006.01)

(52) U.S. Cl.
USPC ................ 710/313; 710/15; 714/25; 324/433

(58) Field of Classification Search ..... 713/300; 714/25; 710/15, 313; 702/117; 324/433
See application file for complete search history.

(56) References Cited

U.S. PATENT DOCUMENTS

| | | | | |
|---|---|---|---|---|
| 5,825,174 | A * | 10/1998 | Parker | 324/106 |
| 6,701,401 | B1 * | 3/2004 | Lu et al. | 710/305 |
| 6,829,726 | B1 * | 12/2004 | Korhonen | 714/25 |
| 6,910,140 | B2 * | 6/2005 | Sanchez | 713/321 |
| 7,243,269 | B2 * | 7/2007 | Saotome et al. | 714/44 |
| 7,392,147 | B2 * | 6/2008 | Lo et al. | 702/122 |
| RE40,541 | E * | 10/2008 | Korhonen | 714/25 |
| 8,204,733 | B2 * | 6/2012 | Cao | 703/21 |
| 2007/0118322 | A1 * | 5/2007 | Tan et al. | 702/117 |
| 2007/0136025 | A1 * | 6/2007 | Lo et al. | 702/122 |
| 2007/0192643 | A1 * | 8/2007 | Li et al. | 713/320 |
| 2008/0215904 | A1 * | 9/2008 | Tsuji | 713/340 |
| 2009/0326905 | A1 * | 12/2009 | Cao | 703/18 |
| 2010/0219790 | A1 * | 9/2010 | Chadbourne et al. | 320/107 |
| 2011/0254556 | A1 * | 10/2011 | Shi | 324/416 |
| 2012/0026644 | A1 * | 2/2012 | Dunn et al. | 361/502 |
| 2012/0049853 | A1 * | 3/2012 | Xie et al. | 324/433 |
| 2012/0137026 | A1 * | 5/2012 | Shen et al. | 710/19 |
| 2012/0153993 | A1 * | 6/2012 | Xie et al. | 327/77 |

* cited by examiner

*Primary Examiner* — Christopher Shin
(74) *Attorney, Agent, or Firm* — Altis Law Group, Inc.

(57) ABSTRACT

A Universal Series Bus USB port detection and testing circuit, configured to detect the voltage output of a USB port of an electronic device, includes a voltage comparing circuit and an indicating circuit. The indicating circuit is connected to an output terminal of the voltage comparing circuit. The voltage comparing circuit compares the voltage output from the USB port against a reference voltage and output a signal whereby the indicating circuit indicates whether the voltage is within, or above, or below, the standard range.

18 Claims, 3 Drawing Sheets

USB PORT DETECTING CIRCUIT

BACKGROUND

1. Technical Field

The present disclosure relates to a Universal Series Bus (USB) port detecting circuit, and more particularly to a USB port detecting circuit capable of detecting whether the voltage of a USB port is within a standard range.

2. Description of Related Art

Today, USB technology is broadly applied in series communication solutions. Before selling or using electronic devices having USB ports, the USB ports need to be tested. A conventional method for testing the USB ports is to use some conventional USB devices such as mice, keyboards, hard disk drives, etc., to directly connect with the USB ports, and so judge whether the USB ports are functioning properly or not. However, this method requires plugging and unplugging the devices to or from the USB ports separately and frequently, which is laborious. Furthermore, the conventional method is unable to detect whether the voltage of a USB port is within a certain, standard range.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the accompanying drawings, like references indicate similar elements. It should be noted that references to "an" or "one" embodiment in this disclosure are not necessarily to the same embodiment, and such references mean at least one.

Figure 1:
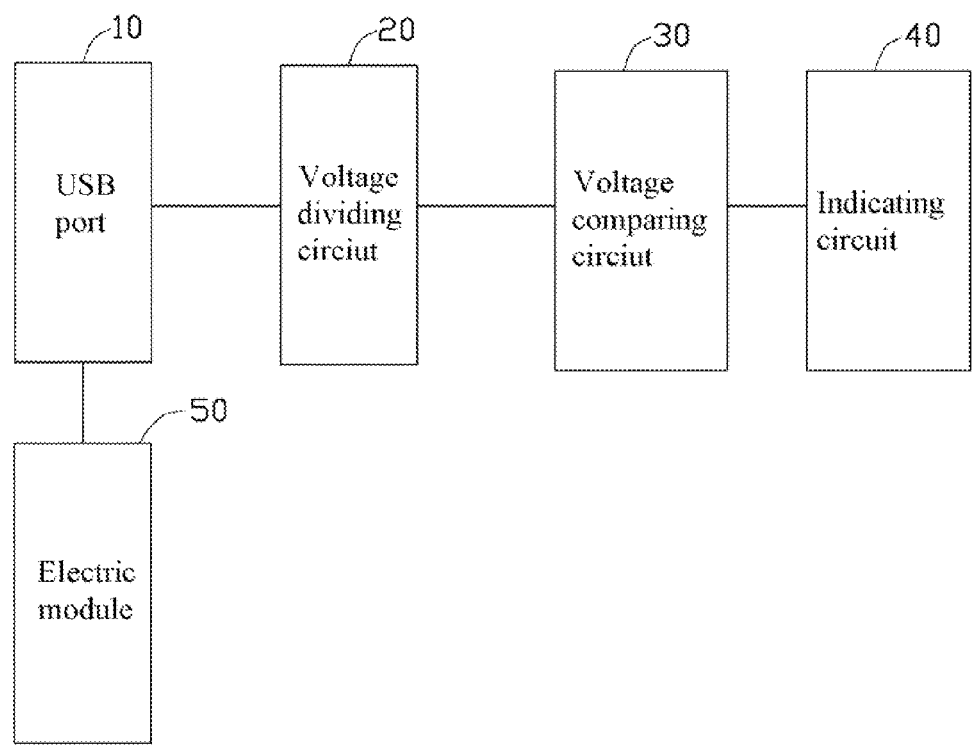
FIG. 1 is a block diagram of a USB port detecting circuit according to an embodiment.

Referring to FIG. 1, an embodiment of a USB port detecting circuit is configured to test whether the voltage output of a USB port 10 of an electronic device (such as a computer) is within a standard range (e.g., 4.75V-5.25V). The USB port detecting circuit includes a voltage dividing circuit 20 connected to the USB port 10, a voltage comparing circuit 30 connected to the voltage dividing circuit 20, an indicating circuit 40 connected to the voltage comparing circuit 30, and an electric load 50 connected to the USB port 10.

Figure 2:
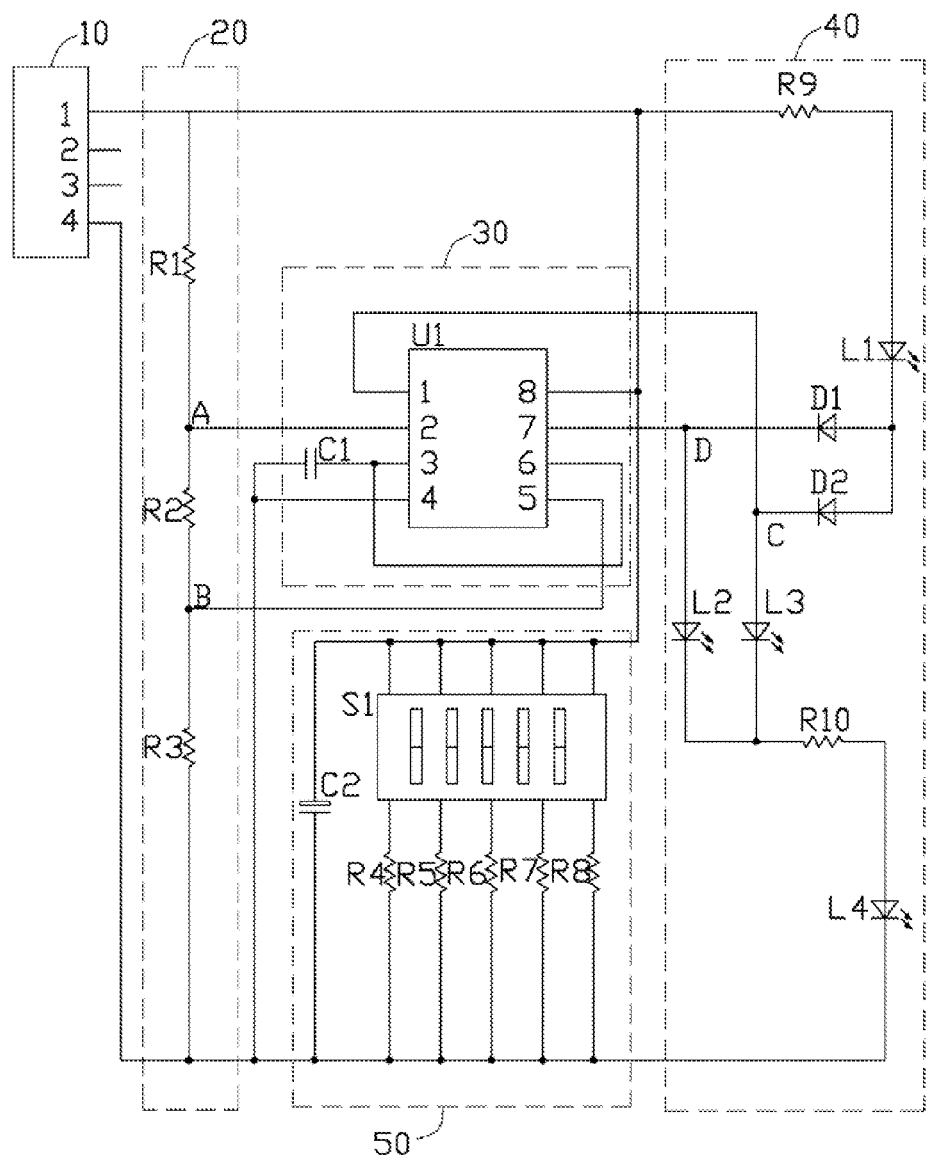
FIG. 2 is a detailed view of the circuit of FIG. 1.

Referring to FIG. 2, the voltage dividing circuit 20 includes a first resistor R1, a second resistor R2, and a third resistor R3 which are connected in series. A first terminal of the first resistor R1 is connected to a positive terminal of the USB port 10, and a second terminal of the first resistor R1 is connected to a first node A. A first terminal of the second resistor R2 is connected to the first node A. A second terminal of the second resistor R2 is connected to a second node B. A first terminal of the third resistor R3 is connected to the second node B. A second terminal of the third resistor R3 is connected to the ground terminal of the USB port 10. In one embodiment, the resistance of the first resistor R1 is substantially equal to that of the third resistor R3. The resistance of the second resistor R2 is three twenty-eighths (3/28) of the resistance of the first resistor R1 or the second resistor R3. For instance, if the first resistor R1 and the third resistor R3 each had a resistance of 14KΩ (Kilohms), the resistance of the second resistor R2 would be 1.5 KΩ (Kilohms).

The voltage comparing circuit 30 includes a voltage comparing chip U1. In one embodiment, the voltage comparing chip U1 is a TSM103 chip. The voltage comparing chip U1 includes pins 1-8. The pin 1 is connected to a third node C. The pin 2 is connected to the first node A. The pin 3 is connected to a first capacitor C1. The pin 4 is connected to the ground terminal of the USB port 10. The pin 5 is connected to the second node B. The pin 6 is connected to the pin 3 and has the same voltage as the pin 3. The pin 7 is connected to a fourth node D. The pin 8 is connected to the positive terminal of the USB port 10.

The indicating circuit 40 includes a first light emitting diode (LED) L1, a second LED L2, a third LED L3, a fourth LED L4, a first diode D1, and a second diode D2. An anode of the first LED L1 is connected to the positive terminal of the USB port 10 via a ninth resistor R9. A cathode of the first LED L1 is connected to the anodes of the first diode D1 and the second diode D2. A cathode of the first diode D1 is connected to the fourth node D1. A cathode of the second diode D2 is connected to the third node C. An anode of the second LED L2 is connected to the fourth node D. A cathode node of the second LED L2 is connected to an anode of the fourth LED L4 via a tenth resistor R10. An anode of the third LED L3 is connected to the third node C. A cathode of the third LED L3 is connected to the anode of the fourth LED L4 via the tenth resistor R10. A cathode of the fourth LED L4 is connected to the ground terminal of the USB port 10.

The electric load 50 includes a switch module S1, a fourth resistor R4, a fifth resistor R5, a sixth resistor R6, a seventh resistor R7, and an eighth resistor R8. The resistors R4-R8 are connected in parallel and located between the positive terminal and the ground terminal of the USB port 10. The switch module S1 includes five switches, one of each switch connected to a resistors R4-R8 respectively. The switches can be switched on or off to respectively increase or decrease the load connected to the USB port 10. A second capacitor C2 is connected to the positive and ground terminals of the USB port 10.

Figure 3:
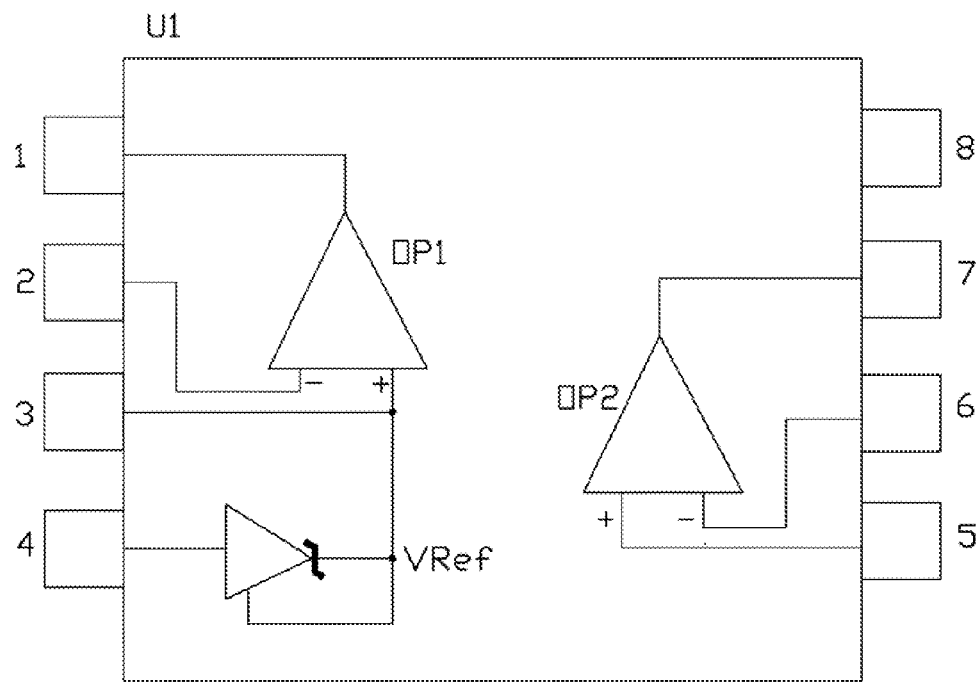
FIG. 3 is a detailed view of the voltage comparing chip included in FIG. 2.

Referring to FIG. 3, the voltage comparing chip U1 includes a first comparator OP1 and a second comparator OP2. The positive input terminal of the first comparator OP1 is connected to the pin 3 and coupled with a reference voltage Vref. The negative input terminal of the first comparator OP1 is connected to the pin 2. The output terminal of the first comparator OP1 is connected to the pin 1. The positive input terminal of the second comparator OP2 is connected to the pin 5. The negative input terminal of the second comparator OP2 is connected to the pin 6. The output terminal of the second comparator OP2 is connected to the pin 7. When a voltage on the positive terminal of the first comparator OP1 (or the second comparator OP2) exceeds the voltage on the negative terminal of the first comparator OP1 (or the second comparator OP2), the output terminal of the first comparator OP1 (or the second comparator OP2) is at a high level. Otherwise, the output terminal of the first comparator OP1 (or the second comparator OP2) is at a low level. The pin 8 is a Vcc+ pin (positive power pin), and the pin 4 is a Vcc− pin (negative power pin). In one embodiment, the Vref is 2.5 volts.

When the voltage of the USB port 10 is within the standard range, e.g., the voltage of the USB port 10 is exactly 5 volts, the voltage of the first node A is substantially equal to 2.6 volts which is greater than the Vref at the positive input terminal of the first comparator OP1. The output terminal of the first comparator OP1 outputs a low level voltage to the third node C via the pin 1. The voltage of the second node B is substantially equal to 2.37 volts which is less than the Vref at the negative input terminal of the second comparator OP2. The output terminal of the second comparator OP2 outputs a low level voltage to the fourth node D. The first LED L1 is powered on and lights up. The second LED L2, the third LED L3, and the fourth LED L4 receive no power. The indicating circuit 40 indicates that the voltage of the USB port 10 is within the standard range.

When the voltage of the USB port 10 is greater than the standard range, e.g., the voltage at the USB port 10 is more than 5.25 volts, the voltage of the first node A is greater than the Vref at the positive input terminal of the first comparator OP1. The output terminal of the first comparator OP1 outputs a low level signal to the third node C via the pin 1. The voltage of the second node B is greater than the Vref at the negative input terminal of the second comparator OP2. The output terminal of the second comparator OP2 outputs a high level signal to the fourth node D. The first LED L1, the second LED L2, and the fourth LED L4 are powered on and light up. The third LED L3 receives no power. The indicating circuit 40 indicates that the voltage of the USB port 10 is greater than the standard range.

When the voltage of the USB port 10 is less than the standard range, e.g., the voltage of the USB port 10 is less than 4.75 volts, the voltage of the first node A is less than the Vref at the positive input terminal of the first comparator OP1. The output terminal of the first comparator OP1 outputs a high level signal to the third node C via the pin 1. The voltage of the second node B is less than the Vref at the negative input terminal of the second comparator OP2. The output terminal of the second comparator OP2 outputs a low level signal to the fourth node D. The first LED L1, the third LED L3, and the fourth LED L4 are powered on and light up. The second LED L2 receives no power. The indicating circuit 40 indicates that the voltage of the USB port 10 is less than the standard range.

In one embodiment, the voltage at the USB port 10 is divided by the voltage dividing circuit 20. The divided voltage is sent to the voltage comparing circuit 30. The voltage comparing circuit 30 compares the divided voltage with the Vref and outputs a high or a low level signal to the indicating circuit 40 according to the voltage level found. Then the indicating circuit 40 can indicate whether the voltage of the USB port 10 is within the standard range.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A Universal Series Bus (USB) port detecting circuit for detecting whether a voltage of a USB port of an electronic device is within a standard range, the USB port detecting circuit comprising:
   a voltage comparing circuit, adapted to compare the voltage of the USB port with a reference voltage and output voltage signals according to a comparing result; and
   an indicating circuit, connected to the voltage comparing circuit, adapted to receive the voltage signals and indicate whether the voltage of the USB port is within the standard ranges;
   a voltage dividing circuit connected to the voltage comparing circuit, the voltage dividing circuit adapted to divide the voltage of the USB port before sending a divided voltage to the voltage comparing circuit, the voltage dividing circuit comprising a first resistor, a second resistor, and a third resistor connected in series; and
   the voltage comparing circuit comprising a voltage comparing chip, the voltage comparing chip comprising a first comparator and a second comparator, a negative input terminal of the first comparator connected to a first node to which the first resistor and the second resistor are connected, an output terminal of the first comparator connected to the indicating circuit, and a positive input terminal of the second comparator connected to a second node to which the second resistor and the third resistor are connected, an output terminal of the second comparator connected to the indicating circuit.

2. The USB port detecting circuit of claim 1, wherein a positive input terminal of the first comparator is coupled to the reference voltage, and a negative input terminal of the second comparator is connected to the positive input terminal of the first comparator.

3. The USB port detecting circuit of claim 2, wherein the indicating circuit comprises a first light emitting diode (LED), a second LED, a third LED, and a fourth LED, an anode of the first LED is connected to a positive terminal of the USB port, a cathode of the first LED is connected to the output terminal of the second comparator; an anode of the second LED is connected to the output terminal of the second comparator, a cathode of the second LED is connected to an anode of the fourth LED; an anode of the third LED is connected to the output terminal of the first comparator, a cathode of the third LED is connected to the anode of the fourth LED; and a cathode of the fourth LED is connected to a negative terminal of the USB port.

4. The USB port detecting circuit of claim 3, wherein the indicating circuit further comprises a first diode and a second diode, the first diode is connected to and located between the cathode of the first LED and the output terminal of the second comparator, and the second diode is connected to and located between the cathode of the first LED and the output terminal of the first comparator.

5. The USB port detecting circuit of claim 1, wherein a resistance of the first resistor is substantially equal to the resistance of the third resistor, and a resistance of the second resistor is less than the resistance of the first resistor or the third resistor.

6. The USB port detecting circuit of claim 5, wherein the resistance of the second resistor is three twenty-eighths of the resistance of the first resistor or the third resistor.

7. The USB detecting circuit of claim 1, further comprising a variable electric load connected to the USB port.

8. A Universal Series Bus (USB) port detecting circuit for detecting a USB port having a first terminal and a second terminal, the USB port detecting circuit comprising:
   a voltage dividing circuit adapted to divide a voltage between the first terminal and the second terminal and output a first divided voltage and a second divided voltage;
   a voltage comparing circuit, connected to the voltage dividing circuit, adapted to compare the first divided voltage and the second divided voltage with a reference voltage, wherein when the voltage of the USB port is within the standard range, the first divided voltage is greater than the reference voltage and the second divided voltage is less than the reference voltage, the voltage comparing circuit output a first voltage signal; when the voltage of the USB port is greater than the standard range, the first divided voltage and the second divided voltage are both greater than the reference voltage, the voltage comparing circuit output a second voltage signal; when the voltage of the USB port are less than the standard range, the first divided voltage and the second divided voltage is both less than the reference voltage, the voltage comparing circuit output a third voltage signal; and an indicating circuit, connected to the voltage comparing circuit, adapted to receive the voltage signals and indicate whether the voltage between the first terminal and the second terminal is within a predetermined range.

9. The USB port detecting circuit of claim 8, wherein the voltage dividing circuit comprises a first resistor, a second resistor, and a third resistor connected in series to output the first divided voltage and the second divided voltage.

10. The USB port detecting circuit of claim 9, wherein the voltage comparing circuit comprises a voltage comparing chip, the voltage comparing chip comprises a first comparator and a second comparator; a negative input terminal of the first comparator is connected to a first node to which the first resistor and the second resistor are connected, an output terminal of the first comparator is connected to the indicating circuit; and a positive input terminal of the second comparator is connected to a second node to which the second resistor and the third resistor are connected, an output terminal of the second comparator is connected to the indicating circuit.

11. The USB port detecting circuit of claim 10, wherein a positive input terminal of the first comparator is coupled to the reference voltage, and a negative input terminal of the second comparator is connected to the positive input terminal of the first comparator.

12. The USB port detecting circuit of claim 11, wherein the indicating circuit comprises a first light emitting diode (LED), a second LED, a third LED, and a fourth LED, an anode of the first LED is connected to the first terminal, a cathode of the first LED is connected to the output terminal of the second comparator; an anode of the second LED is connected to the output terminal of the second comparator, a cathode of the second LED is connected to an anode of the fourth LED; an anode of the third LED is connected to the output terminal of the first comparator, a cathode of the third LED is connected to the anode of the fourth LED; and a cathode of the fourth LED is connected to the second terminal.

13. The USB port detecting circuit of claim 12, wherein the indicating circuit further comprises a first diode and a second diode, the first diode is connected to and located between the cathode of the first LED and the output terminal of the second comparator, and the second diode is connected to and located between the cathode of the first LED and the output terminal of the first comparator.

14. The USB port detecting circuit of claim 9, wherein a resistance of the first resistor is substantially equal to the resistance of the third resistor, and a resistance of the second resistor is less than the resistance of the first resistor or the third resistor.

15. The USB port detecting circuit of claim 14, wherein the resistance of the second resistor is three twenty-eighths of the resistance of the first resistor or the third resistor.

16. The USB detecting circuit of claim 8, further comprising a variable electric load connected to the first terminal and the second terminal.

17. The USB port detecting circuit of claim 8, wherein the voltage comparing circuit comprises a first comparator and a second comparator; the first comparator compares the first divided voltage with the reference voltage, and the second comparator compares the second divided voltage with the reference voltage.

18. The USB port detecting circuit of claim 17, wherein the indicating circuit comprises at least tow light emitting diodes; one is connected to the first comparator, another is connected to the second comparator, the at least tow light emitting diodes are powered on and light up according to comparing results of the first comparator and the second comparator.

* * * * *